United States Patent
Marttila (10) Patent No.: US 9,030,512 B2
(45) Date of Patent: May 12, 2015

(54) LASER PROCESS ALIGNMENT MEASURING METHOD

(71) Applicant: Tom Marttila, Espoo (FI)

(72) Inventor: Tom Marttila, Espoo (FI)

(73) Assignee: Tecnomar Oy (FI)

( * ) Notice: Subject to any disclaimer, the term of this patent is extended or adjusted under 35 U.S.C. 154(b) by 0 days.

(21) Appl. No.: 13/910,852

(22) Filed: Jun. 5, 2013

(65) Prior Publication Data

US 2013/0328994 A1    Dec. 12, 2013

(30) Foreign Application Priority Data

Jun. 8, 2012   (FI) ...................................... 20125633

(51) Int. Cl.
- *B41J 2/47* (2006.01)
- *B41J 2/045* (2006.01)
- *B23K 26/03* (2006.01)
- *B23K 26/08* (2014.01)
- *B41J 11/46* (2006.01)
- *G01D 15/14* (2006.01)

(52) U.S. Cl.
CPC .......... *B41J 2/04505* (2013.01); *B23K 26/032* (2013.01); *B23K 26/0846* (2013.01); *B41J 11/46* (2013.01)

(58) Field of Classification Search
USPC ........................................................ 347/225
See application file for complete search history.

(56) References Cited

U.S. PATENT DOCUMENTS

| | | | | |
|---|---|---|---|---|
| 4,515,867 A | * | 5/1985 | Bleacher et al. | 428/204 |
| 5,855,969 A | * | 1/1999 | Robertson | 427/555 |
| 5,903,378 A | * | 5/1999 | Takano et al. | 359/201.1 |
| 6,685,297 B2 | * | 2/2004 | Butterfield et al. | 347/19 |
| 8,405,831 B2 | * | 3/2013 | Carlson et al. | 356/429 |
| 2005/0099439 A1 | * | 5/2005 | Folkins | 347/8 |
| 2005/0158107 A1 | | 7/2005 | Acher | |
| 2006/0223236 A1 | * | 10/2006 | Nomura et al. | 438/121 |
| 2009/0315316 A1 | * | 12/2009 | Staub et al. | 283/72 |
| 2010/0043942 A1 | * | 2/2010 | Tanaka et al. | 156/64 |
| 2011/0256996 A1 | | 10/2011 | Palm et al. | |
| 2012/0013699 A1 | * | 1/2012 | Ueta et al. | 347/225 |

FOREIGN PATENT DOCUMENTS

| DE | 10 2004 049017 A1 | 4/2006 | | |
|---|---|---|---|---|
| FI | 121592 | 1/2011 | | |
| JP | 2003248207 A | * | 9/2003 | ............... G02F 1/13 |

(Continued)

OTHER PUBLICATIONS

Finnish Search Report dated Feb. 7, 2013 issued in corresponding Finnish patent application No. 20125633.

*Primary Examiner* — Jannelle M Lebron
*Assistant Examiner* — Jeremy Bishop
(74) *Attorney, Agent, or Firm* — Ostrolenk Faber LLP (57) ABSTRACT

A laser process alignment measuring method applicable to a reel-to-reel manufacturing process including a laser process stage, wherein before at least one laser process stage, marks, patterns or surfaces (4,9) are made with printing ink on the base or carrier material of the web (2), and on which the laser beam used can make a mark (7, 10), for example, by removing or changing the printing ink, whereby at the laser process stage, another mark is plotted with the laser beam on the mark et al. printed with printing ink, and the position of the mark et al. printed with printing ink (4, 9) and the mark plotted with the laser (7, 10) are read optically to measure the alignment of the printing ink stage and the laser process stage.

10 Claims, 3 Drawing Sheets

(56) References Cited

FOREIGN PATENT DOCUMENTS

| JP | 2011-110887 | 6/2011 |
| JP | 2012103500 A * | 5/2012 |
| WO | WO 01/51275 A1 | 7/2001 |

* cited by examiner

LASER PROCESS ALIGNMENT MEASURING METHOD

CROSS-REFERENCE TO RELATED APPLICATIONS

The present application claims priority of Finnish Patent Application No. 20125633, filed Jun. 8, 2012, the contents of which are incorporated by reference herein.

TECHNICAL FIELD OF THE INVENTION

The invention relates to the precise mutual alignment, or register control, of laser processes or other processes used in reel-to-reel mass production.

BACKGROUND OF THE INVENTION

Many reel-to-reel manufacturing processes include one or more printing process stages, and for several successive printing process stages ready-made register control systems, are available which are based on the identification of marks printed in each printing unit by means of computer vision and on controlling the printing units on the basis of the observations made by the computer vision on the marks. A good register control system is capable of aligning printing process stages carried out in different units in such a way that, for example, a high-quality colour picture is produced in the finished product even though each colour is printed in its own unit.

Laser has already found its way into many industrial processes and it will become more widely used also in different reel-to-reel manufacturing processes. At the laser processing stage, procedures are often carried out on the material travelling from reel to reel, which do not leave any marks on the base or carrier material of the moving web, but bring about changes in some other part or layer of the web—from the point of view of the process, it is specifically advantageous if the wavelength and other properties of the laser can be selected in such a way that the laser has no effect on the base or carrier material of the web. A problem arising in this case is that, unlike the printing process stages, the laser process stage cannot produce any such marks or traces in the base or carrier material of the web, which could be utilised in register control. This type of laser light is typically also not shone on the surface of the base material.

It is often specifically the reel-to-reel manufacturing processes including a laser process stage that are the ones with a particularly great need for mutual alignment, or register control, of process stages, and thus the inability of the laser to produce a suitable mark for register control is a real problem.

The aim of the invention is to offer a solution by means of which a reel-to-reel manufacturing process including printing process stages and/or laser process stages can be provided with register control for ensuring the mutual alignment of the process stages. The invention also provides a solution for the mutual alignment of scanners in a laser apparatus comprising several parallel laser patterning devices.

PRIOR ART AND THE PROBLEM TO BE SOLVED

Laser processing is already applied in reel-to-reel manufacturing processes which also include printing process stages. Typically, this type of laser process stage is triggered from marks printed on the base or carrier material of the web, controlled by an optical sensor or computer vision. Since the laser is usually unable to produce a corresponding mark on the base or carrier material of the web, the accuracy of alignment cannot be monitored or corrected and, for example, the drifts typical of laser process devices, such as laser scanners, have the effect that sufficient mutual alignment accuracy between the printing process stage and laser process stage cannot be maintained in the production run.

In the Applicant's patent FI 121592 B a method is described which applies selective lamination, that is, patterned adhesive between the base material and the conductive foil, and where the conductive foil is patterned to the desired form after selective lamination. It is preferable to carry out the selective lamination with a printing method, in which case register marks can be printed on the base or carrier material of the web, typically on its edge or edges outside the conductive foil, for further processing, such as patterning. The patterning of the conductive foil, on the other hand, is preferably made by laser, which leaves hardly any marks on the base or carrier material of the web and in which the patterning beam is controlled by a scanner based on turning mirrors. By means of the above-mentioned selective patterned gluing, the conductive foil is laminated to the base material selectively. In that case, the patterning of the adhesive remains under the conductive film, conductive foil, and the laser is used to pattern a conductive pattern partly on the adhesive area, partly along the edges of the adhesive area. The adhesive patterns are thus hidden under the conductive foil before laser patterning and after laser patterning it is not possible to see where the edge of the adhesive pattern is or was with respect to the edge of the conductive pattern cut by the laser, and thus the alignment of the laser patterning or its monitoring cannot be carried out on the basis of the boundaries of the adhesive patterns.

In industrial production, the production runs are long measured both by the dimensions of the web and the patterns and by time, whereby the drift phenomena typical of laser devices, for example, as a result of heating, have a significant effect on the accuracy of patterning, unless they can be compensated for or eliminated. The effect may be so great that without compensation or elimination, it may not be possible to meet the requirements of accuracy set for the final product, and in any case the effect on accuracy is disadvantageous and significant.

The aim of the invention is to provide a solution by means of which the printing and laser process stages in reel-to-reel mass production can be aligned with each other also for the duration of a long mass production run. The invention can also be applied in aligning the laser process stage with other process stages and other laser process stages.

DESCRIPTION OF THE INVENTION

The method according to the invention is based on the technical solutions of commonly used laser process devices and register control systems, which makes the invention easy to implement.

The essence of the invention is that, on the basis of experience, even a laser which leaves hardly any or no marks on the base or carrier material of the web, plots a negative mark on a register mark made with printing ink. Here, a negative mark means that the printing ink can be accurately and easily removed with the laser, even down to the surface of the base or carrier material of the web, whereby a mark is created which is easily detectable by computer vision. The register mark is preferably printed in such a way that there is a good contrast between the mark and the base or carrier material of the web, and when the negative mark made by the laser reveals a part of the base or carrier material of the web under the printed register mark, the negative mark will also have a good contrast. Plotting a negative mark on a mark or surface made with printing ink is usually also a clearly visible and observable event, even if it is difficult or impossible to see and observe the impact of the laser beam on the surface of the base material. It has, in addition, been noted that the area covered by printing ink brings about a change in the reflection and/or penetration of the light from the laser beam compared to an area on which there is no printing ink.

In the method according to the invention, at the printing process stage marks are printed with printing ink on the base or carrier material of the web, at the laser process stage a negative mark is made with the laser on this mark printed at the printing process stage, and during or after the laser process stage computer vision or other suitable sensor equipment is used to monitor the matching of the printed mark and the negative mark made on it with each other and the laser process stage is controlled on the basis of the information in such a way that the laser process stage is aligned with the printing process stage. The alignment can alternatively be monitored by measuring the change caused by the mark made with printing ink in the reflection or penetration of the laser beam, compared with areas with no printing ink on them.

When the computer vision system or other suitable sensor equipment is located after the laser process stage, the size and shape of the negative mark can be selected quite freely. In the selection, it is advisable to aim at it being easy for the computer vision system or similar equipment to determine the mutual distances between marks, that is, the accuracy of alignment, precisely and rapidly. When the computer vision system or other suitable sensor equipment is located in the laser process stage, that is, the equipment is used to monitor the plotting of the negative mark with the laser, it is advisable to select the size and shape of the negative mark to be such that the web is able to move only a short distance while the laser plots the mark—a preferable negative mark is in this case often a spot which the laser makes with one or a few pulses, in which case the plotting of the mark can be positioned in one picture taken by the camera of the computer vision system or a similar sensor, even if short exposure is used. In this case, the determination of the alignment of the marks can be done rapidly, at best so rapidly that if the laser starts its working cycle by plotting a negative mark or marks, the alignment of the end of the working cycle can be corrected on the basis of this information. If no later process stage, quality assurance or other purpose requires clearly distinctive negative marks, a mark does not have to be plotted with the laser down to the base material, but it suffices that the impact of the laser beam on the mark or surface made with printing ink is detectable at the moment of occurrence.

When the computer vision system or other suitable sensor equipment is included in the laser process stage, the equipment can also be used to scan a recently produced negative mark. In this case, it is advisable to select the size and shape of the negative mark to be such that it can be rapidly plotted by laser and read by the equipment. The plotting of the marks and determination of the alignment can be carried out rapidly, at best so rapidly that if the laser starts its working cycle by plotting a negative mark or marks, the alignment of the end of the same working cycle can be controlled on the basis of this information.

In both of the solutions described above, a negative mark can easily be plotted also after correcting the alignment, whereby the success and accuracy of the correction of the alignment can be monitored.

When the computer vision system or other suitable sensor equipment is included in the laser process stage, the monitoring and measurement of the alignment may also be based on the different way in which the laser light either reflects from the surfaces of the base material or the printed mark, or the different way in which the laser light penetrates the base material alone and the type of part of the base material on the surface of which is a printed mark. If the laser light penetrates the base material well, the alignment can be measured from the opposite side of the base material with respect to the laser, and in this case it is not a disadvantage if the base material reflects the laser light poorly. If the base material reflects the laser light poorly and it is desirable to measure the alignment on the laser's side of the base material, the surface of the base material can be treated, for example by printing, to reflect the laser light better, and the printed marks reflecting in a different manner can be made in such a way that this treated surface of the base material surrounds the printed marks. It then suffices that the printed mark brings about a change in the reflection or penetration of the laser light compared to a plain or treated base material—the mark does not have to react to the laser light otherwise. Thus, the essential difference of this alternative compared with those described above is that the laser does not leave on the web any marks relating to its register control, which may be a limitation from the point of view of further processing and/or quality assurance.

One preferred embodiment is such that, at least at the moment of determining the alignment, the diameter of the laser beam is larger than the printed mark, in which case the printed mark fits inside the laser light beam and the location of the printed mark with respect to the laser light beam can be determined easily and quickly. By adjusting the optics of the laser equipment, the diameter of the beam can often be increased, which is advantageous both in fitting the printed mark inside the beam and in decreasing the intensity of the laser to such a low level that the printed mark will not be at least excessively damaged. The monitoring and measurement of the alignment is based on identifying with the laser's light-sensitive computer vision system or other suitable sensor system the change caused by the printed mark in the laser beam in the reflection or penetration of the beam compared with an area which is not covered by printing ink. When applying this embodiment, the equipment must be included in the laser process stage and the measurement of the alignment may be very quick—it may be based, for example, on only one pulse shot by the laser. If the measurement of the pulse is carried out at the beginning of the working phase of the laser, at best the alignment at the end of the same work phase can be controlled on the basis of this information.

The advantage of this embodiment is that the location of a stopped beam can also be measured from a single pulse, and much more accurate measurements can be made than the diameter at the moment of measurement. Measuring merely the location of the printed mark by means of a laser beam larger than the mark requires that the laser beam is distinguishable from the base material. If this is not the case, a mark or an area larger than the laser beam can be used, in which is made a negative mark, for example an annular pattern, whereby the edge of the beam used for measurement hits the printed pattern and the negative mark made in the printed pattern, for example, a ring or an empty hole, acts as the reference. The negative mark may be either printed or it may have been plotted at an earlier laser process stage. It is obviously also possible, for example, to print a larger area outside the mark, which produces a suitable contrast for measurement.

The monitoring and measurement of the alignment can also be carried out without an actual computer vision system by connecting a relatively simple light sensor to the laser equipment. This type of an arrangement can be carried out both in such a way that a negative mark is plotted on the printed mark, and in such a way that no negative mark is plotted on the printed mark. It is determined by means of the light sensor either that the laser beam is plotting a negative mark on the printed mark, or that the laser beam hits the negative mark. Both situations change the illumination compared to a situation where the laser beam meets the base material alone. The arrangement is, therefore, based on a moving laser beam crossing the border between the base material and the printed mark in so many places that the location of the mark can be identified. The laser equipment always can determine the location of the beam with respect to its own coordinates, and on the basis of the information provided by the light sensor, the laser equipment is able to determine the location of the printed mark in its own coordinates and on the basis of that to monitor and measure the alignment of the laser process on the printed marks. The advantage of this arrangement is the simplicity and affordability of the light sensor compared to a computer vision system, and the fact that a direct view from the sensor to the laser beam is not necessarily required, its disadvantage being that measuring the alignment is based on the identification of the edges of the printed mark by means of a moving laser beam, due to which measurement is typically slower than with the arrangements described above.

One preferred embodiment is such that the printed mark is, for example, circular or square and a laser beam forms a cross on the base material and the printed mark when the laser beam impinges on the base material and the printed mark, the cross being so large that each arm of the cross crosses the border between the base material and the printed mark. The size of the printed mark is selected to be such that the centre of the cross is always inside the mark. It may be advantageous for the accuracy of measurement of positioning that the laser plots each arm of the cross either outwards from the centre or to the centre from the outside, whereupon the beam crosses the border between the base material and printed mark always in the same direction, that is, either from the side of the mark to the side of the base material or vice versa. Should it be desirable for the laser not to plot a negative mark, the power of the laser must be decreased considerably, because increasing the diameter of the beam is disadvantageous for measuring accuracy. If the laser is allowed to plot a negative mark on the printed mark, it is not necessary to change the power of the laser or the diameter of the beam and the negative mark produced can be utilised at later stages or, for example, in quality assurance. The position of a beam with a large diameter but sharp edges can also be measured in such a way that the beam is moved over a mark of approximately the size of the diameter of the beam, for example, over a line, whereby crossing the edges increases the amount of light penetrating the transparent web considerably. The beam can also be moved along the line at a small angle with respect to the centreline of the line, whereupon the beam moves slowly, perpendicularly to the line. In this way, the crossing of the edge by the beam can be measured on both sides of the line, the centreline of the line being between them.

A special case of laser process register control is the internal register control of the laser equipment. For example, when the web is wide with respect to the working area of one laser scanner, the laser process stage can be carried out with laser equipment comprising several adjacent scanners, so that the width of the web can be covered. In such a case, it is often not possible or sensible to make printed marks in the base material to align each laser scanner independently, but to align the laser scanners with each other. Thus, for example, only one scanner is aligned with register marks printed on the edge of the web, and mutual alignment of the scanners ensures that the alignment of the laser process is in order over the entire width of the web.

Two laser scanners can be aligned with each other by making a negative mark with both and determining their alignment with each other by means of a computer vision system or other suitable sensor equipment. When a wide web is covered with several laser scanners, their working areas typically intersect and then it is often advantageous to make the negative marks to be tracked in these intersecting areas.

Aligning two laser scanners with each other requires a surface on which the laser beam is able to plot a mark. This surface may be a printed, coated or otherwise treated surface on top of the base material, there being no great demands on the size, shape or accuracy of location of the area, as long as each scanner is able to plot its mark on it. When the product to be processed is a selectively laminated laminate, the layer of the laminate to be patterned, such as the conductive foil, can be used as the joint surface. The marks can then be made either in the part of the layer to be patterned remaining in the laminate or in the part to be removed from the laminate. When the marks are made in the part of the layer to be patterned remaining in the laminate, also the remaining part itself can be the mark—it may be a part remaining in the laminate in any case, a projection or other feature or a separate adhered area made for alignment. In connection with a selectively patterned laminate a printed, coated or otherwise treated area under the part of the patterned layer to be removed can also be used, because the laser can typically plot a mark also through the layer to be patterned.

A preferred embodiment in connection with a selectively laminated laminate is one where mutually aligned scanners make their marks in an area in the part of the layer to be patterned and removed from the laminate, where their working areas intersect. The limitation here is that the computer vision system or other suitable sensor equipment must be positioned before the removal of the part to be removed of the layer to be patterned. The advantages are that the marks can be positioned on top of one another, that no separate surface is required as a base for the marks, and that no marks of the alignment are typically left in the finished product.

In general, it may be said that from the point of view of alignment monitoring and measurement, it is advantageous to select the marks to be tracked by a computer vision system or other suitable sensor equipment to be such that the location of their centre is easy and/or quick to determine even with an existing algorithm, and to position the marks with respect to one another in such a way that when the alignment is in place, their centres connect. The distance between the centres of the marks then equals the alignment error and the distance, therefore, does not have to be compared to any target value, which in the worst case changes in each case. Therefore, a preferred embodiment for aligning laser processing is to print circular or square marks on the web and to aim at plotting a negative mark in the shape of a circle, spot or cross in the centre of each one with the laser, and a preferred embodiment for mutually aligning laser scanners is to plot circular marks with one scanner and to aim at plotting a mark in the shape of a different size circle, spot or cross in the centre of each one with another scanner. In the simplest case, register marks are printed on one edge of the base or carrier material of the web at the printing process stage, on which marks the laser then makes negative marks at the laser process stage. Thus, by monitoring the mutual alignment of the marks and by controlling the laser process stage on the basis of it, the laser process stage can be aligned with the printing process stage in the longitudinal direction, or direction of travel, of the web and, if necessary, also transversely to the web even for the duration of a long production run.

If marks are printed elsewhere on the web than only on one edge of the base or carrier material of the web, and on these marks are made negative marks with the laser at the laser process stage, the alignment of the laser process stage with the printing process stage can be monitored and controlled in a more versatile manner than by means of marks printed only on one edge. For example, if register marks are printed on both edges of the base or carrier material of the web at the printing process stage, and negative marks are made on these marks at the laser process stage, by monitoring the alignment of the marks with each other, the laser process can be controlled to match with the printing process stage, also taking into account the angle of printing and possible changes taking place in it with respect to the direction of travel of the web. Similarly, by means of at least two or more marks, the scale of laser processing can be monitored and controlled, that is, care can be taken that the dimensions of laser processing remain correct with respect to the dimensions of printing even for the duration of a relatively long production run. In order to calibrate a dimensional change in the lateral direction of the web, at least two markings in the lateral direction are required, for example on both edges. The web is usually divided into several printed circuit boards in the lateral direction, which are finally cut off from each other. It usually suffices to align one coordinate point of each circuit to be detached in the lateral direction. A single circuit is usually so small that a scaling error will not grow too large within its area.

In the process stages following the laser process stage, instead of a printed register mark, a negative mark made by the laser, or a combination of a printed mark and a negative mark made by the laser can be used as a register mark. There is often a need to align further processing specifically with laser processing exclusively or with emphasis on it, and thus negative marks or using a combination of a printed mark and a negative mark provide an advantageous opportunity for this.

A printed mark may also be the adhesive pattern printed in the selective lamination described above, especially if a separate pattern is printed as a mark or the adhesive pattern extends beyond the conductive foil, in which case the mark remains visible and a negative mark can be made on it with the laser. A suitable area or surface for the laser can also be printed with other printing ink, whereby the negative mark made on it by the laser can be compared with a mark made at some other stage, for example, a mark printed with an adhesive. In this case, the other printing ink can be selected in such a way that a good contrast is acquired for both the adhesive and the laser mark. Instead of printing other methods can also be used. For example, along the entire edge area of the base material a strip for laser markings can be made and the register marks can be printed in this area, but the laser marks can be made outside the printed register marks. This may be advantageous or necessary if the laser used does not plot properly on the printed marks. In that case, a pattern, for example a circle, can be plotted outside the printed mark, or an empty area can be left on the printed mark for plotting. The printed mark may be, for example, a line pattern, such as a circle, inside which is plotted another circle with the laser, the concentricity of which is measured with computer vision.

The invention can also be applied to manufacturing processes in which the laser process stage is the first of the actual process stages. In that case, before the laser process stage, on the web are printed either register marks or other areas with printing ink, on which the laser can make a negative mark. The stages following the laser process stage can then be aligned with the negative marks made by the laser.

Several negative marks can also be made with the laser distinguishable from one another on the same surface, for example, circles or squares or their combinations with a cross. This can be utilised in aligning several laser process stages with one another and possibly with other process stages. It is also possible to make one mark before the correction based on register control and another after it, whereby the extent and success of the correction can be monitored.

The invention can be applied irrespective of whether the process stages are on the same or different production lines.

A preferred embodiment of the invention is described in the following, with reference to the accompanying drawings.

DESCRIPTION OF EMBODIMENTS

Figure 1:
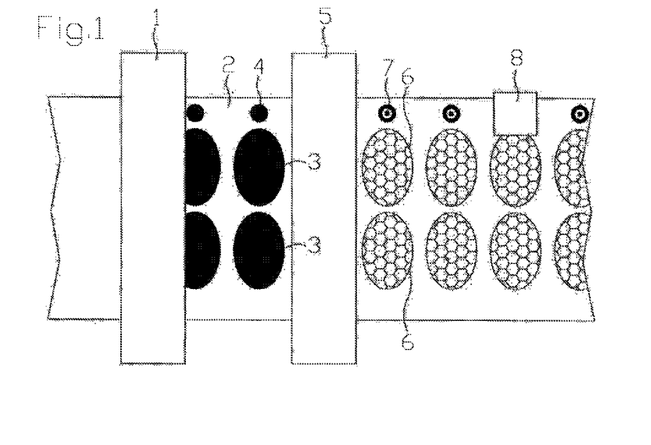
FIG. 1 shows a preferred embodiment of the method according to the invention with marks on only one edge of the web.

In FIG. 1, the web moves from left to right. When passing through the printing process stage 1, on one edge of the base or carrier material 2 of the web are printed register marks 4, and in the area to be processed typically also something is printed, such as the patterns 3 here. When the web passes through the laser process stage 5, the laser makes a negative mark 7 on the printed register mark 4 at the same time as it changes the area to be processed in one way or another, which is shown as a change between patterns 3 and 6. After the laser process stage follows the computer vision or other sensor system 8 by means of which the position of the negative mark 7 with respect to the printed register mark 4 is determined, and by means of this information the laser process stage 5 is controlled in such a way that the negative marks 7 remain with sufficient accuracy in the correct position, for example in the centre, with respect to the printed register marks 4 throughout the production run.

Figure 2:
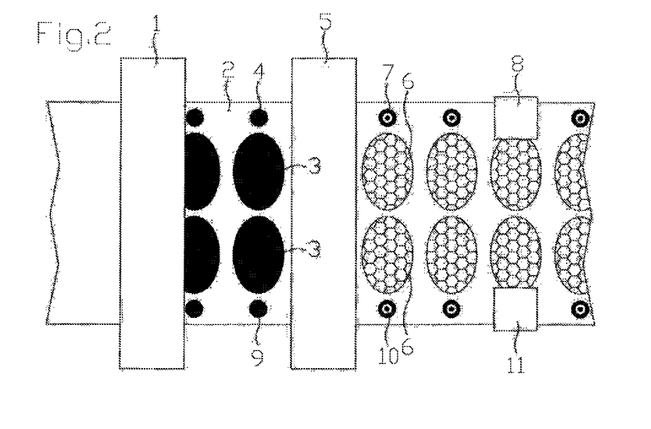
FIG. 2 shows a preferred embodiment of the method according to the invention with marks on both edges of the web.

In FIG. 2, the web moves from left to right. When passing through the printing process stage 1, on the edges of the base or carrier material 2 of the web are printed register marks 4 and 9, and in the area to be processed typically also something, such as the patterns 3 here. When the web passes through the laser process stage 5, the laser makes negative marks 7 and 10 on the printed register marks 4 and 9 at the same time as it changes the area to be processed in one way or another, which is shown as a change between patterns 3 and 6. The laser process stage is followed by the computer vision or other sensor systems 8 and 11, by means of which is determined the position of the negative marks 7 and 10 with respect to the printed register marks 4 and 9, and the laser process stage 5 is controlled with this information in such a way that the negative marks 7 and 10 remain with sufficient accuracy in the correct position with respect to the printed register marks 4 and 9 throughout the production run. By using two or more marks, it is possible to maintain the laser process stage both in the same position in the direction of travel of the web and at the same angle with respect to the direction of travel of the web as the print, and it is also possible to scale the laser processing in such a way that the distance between the negative marks remains the same as the distance between the printed marks.

Here, the register marks 4 and 9 are circles and the negative marks 7 and 10 are annular, but their shapes are unimportant as such. What is essential is that the marks function reliably with the computer vision or other sensor system. It is also possible to use, for example, successive parallel stripes, in which case a bar code scanner device can also be used for measuring their alignment, which measures the position of the bar plotted by the laser on the printed stripes in each stripe. The measurement of the position is also possible by means of pulse ratio measurement, in which case the width of the printed stripe is measured on both sides of the laser bar. By means of the bars obviously only one dimension can be measured at a time.

Figure 3:
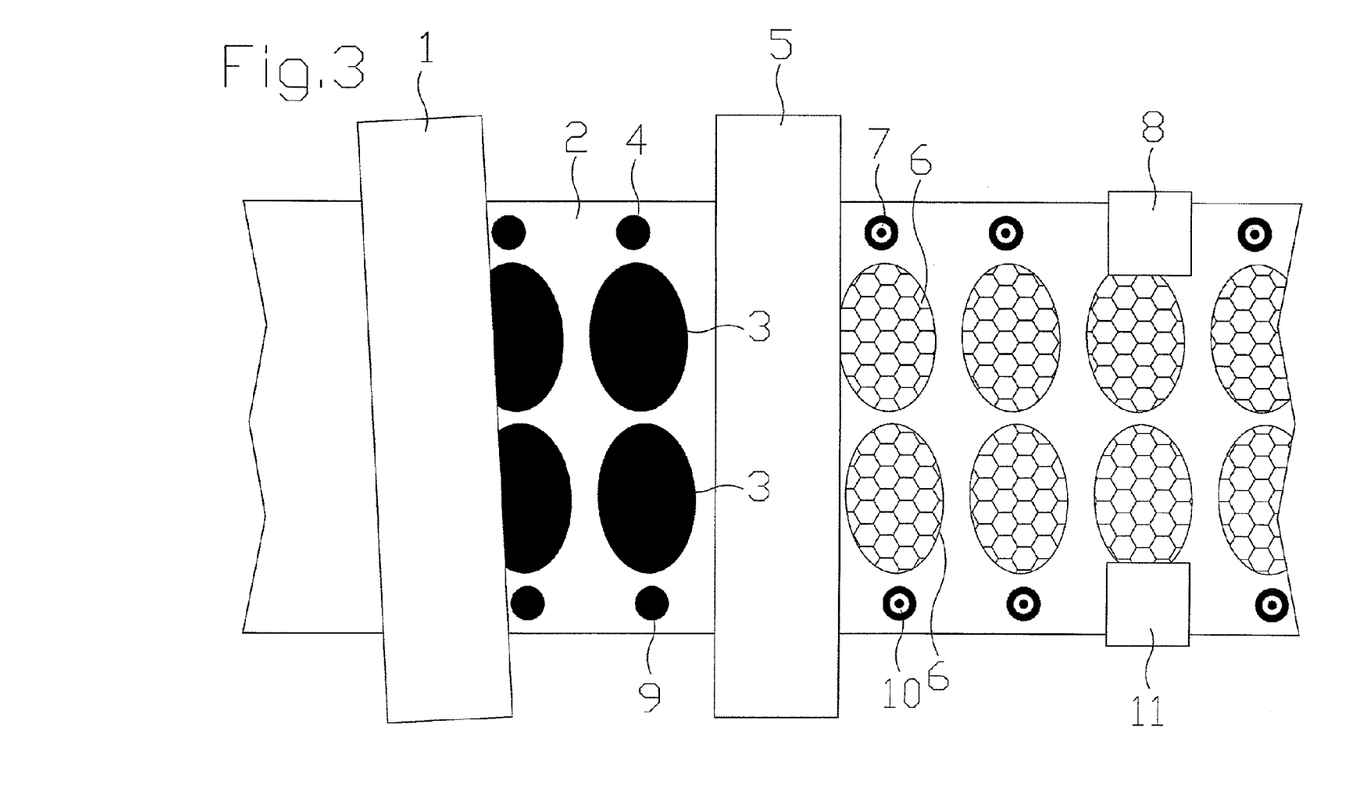
FIG. 3 shows a preferred embodiment of the method according to the invention with marks on both edges of the web and with the marks and patterns on the web in a process stage preceding the laser process stage extending at an angle relative to the longitudinal direction of travel of the web in the process stage preceding the laser process stage and in the laser process stage.

FIG. 3 is the same as FIG. 2, except that the printing process stage 1 is positioned at a first angle relative to the longitudinal direction of travel of the base or carrier material 2 of the web and at a second angle relative to the transverse direction, which is relative to the longitudinal direction of travel of the base or carrier material 2 of the web. Since the printing process stage 1 is positioned at a first angle relative to the longitudinal direction and at a second angle relative to the transverse direction, the printed register marks 4 and the patterns 3 printed during the printing process stage 1 are also positioned at a first angle relative to the longitudinal direction and at a second angle relative to the transverse direction.

Figure 4:
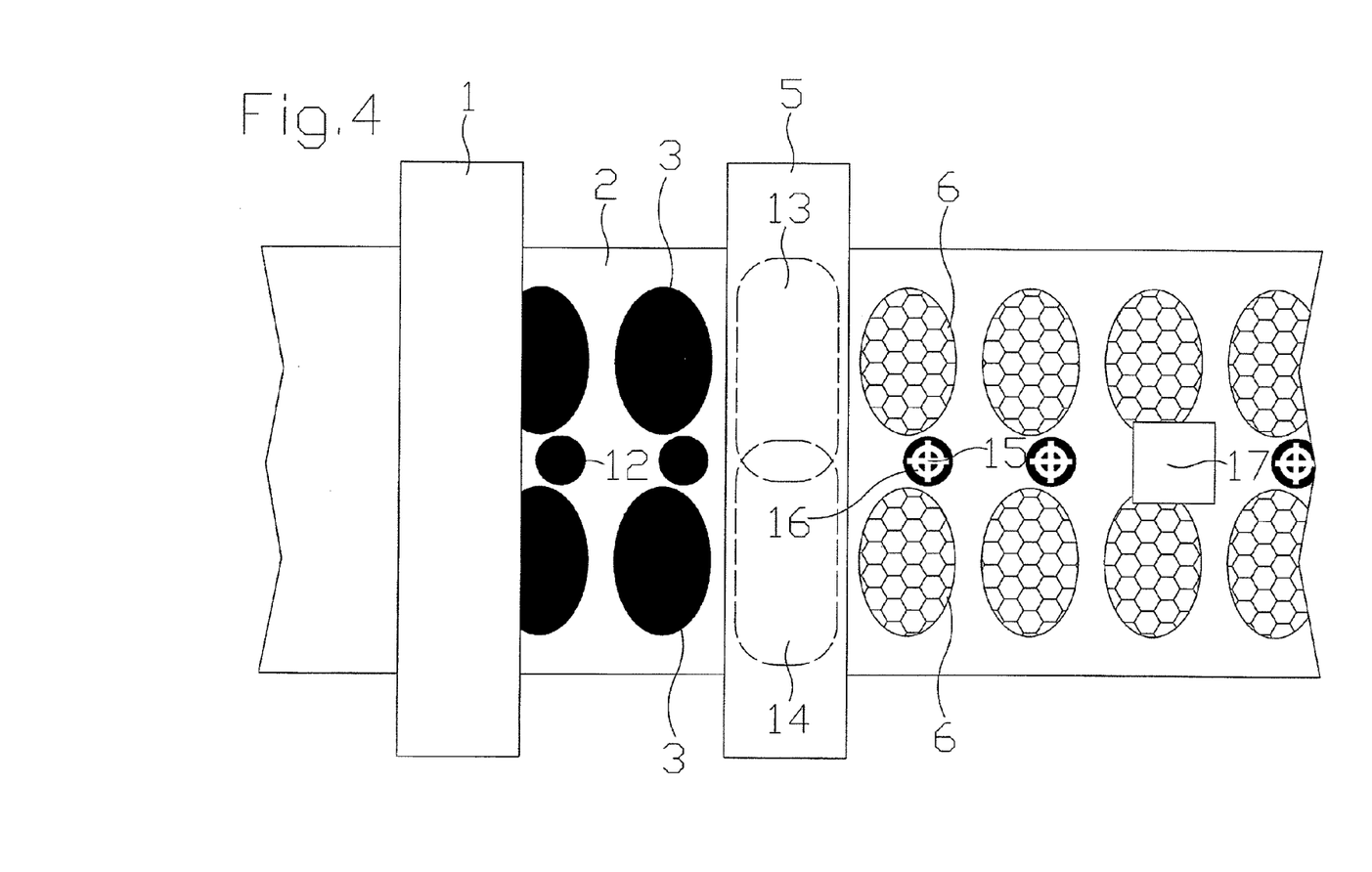
FIG. 4 shows a preferred embodiment of the method according to the invention with marks in the center of the web and with two adjacent laser devices arranged in a transverse direction relative to the longitudinal direction of travel of the web.

In FIG. 4, the web moves from left to right. When passing through the printing process stage 1, register marks 12 are printed in the center of the base or carrier material 2 of the web, the register marks 12 also being centrally located with respect to the patterns 3. Register marks 12 and patterns 3 pass through the laser process stage 5. During the laser process stage 5 adjacent laser devices, belonging to the laser process stage 5, which have scanning fields 13 and 14 overlapping in the area where the register marks 12 are located, make negative marks on the register marks 12. One of the laser devices makes a negative mark, a cross 15, on the register mark 12, and the other of the laser devices makes a negative mark, which is a circle 16, on the register marks 12. Computer vision or other sensor system 17 detects the relative positions of cross 15, and circle 16, so as to align laser process stage 5 with printing process stage 1 and so as to align cross 15, and circle 16, with each other.

However, it should be noted that, during the laser process stage 5, the adjacent laser devices may make negative marks on coated or otherwise treated areas of the base or carrier material 2 of the web outside of the register marks 12, if the adjacent laser devices can make negative marks on the coated or otherwise treated areas of the base or carrier material 2 of the web, or on the base or carrier material 2 of the web itself outside of the register marks 12, if the adjacent laser devices can make negative marks on the base or carrier material 2 of the web itself. In such a case, the combination of the negative marks and the register marks 12 may be used as register marks. In addition, during the laser process stage 5, the register marks 12 may not be printed at all, and, instead, the adjacent laser devices may make negative marks on coated or otherwise treated areas of the base or carrier material 2 of the web, if the adjacent laser devices can make negative marks on the coated or otherwise treated areas of the base or carrier material 2 of the web, or on the base or carrier material 2 of the web itself, if the adjacent laser devices can make negative marks on the base or carrier material 2 of the web itself. In such a case, the negative marks alone may be used as register marks.

Between the printing process stage 1 and the laser process stage 5 may be other process stages such as lamination of the metal foil, in which case the patterns 3 are lamination adhesive, to which the metal foil covering the centre part of the web is attached at the lamination process stage, the foil being patterned at the laser process stage 5 at the same time as the laser is used to make the negative marks 7 on the register marks 4 and possibly also the negative marks 10 on the possible register marks 9.

The invention claimed is:

1. A laser process alignment measuring method applicable to a manufacturing process including a laser process stage, comprising:
    before at least one laser process stage, applying at least one first mark on a surface of a base material of a web with printing ink;
    at the at least one laser process stage, forming at least one second mark with the laser beam onto the at least one first mark printed with printing ink by removing or changing the printing ink; and
    optically reading the positions of the at least one first mark printed with printing ink and the at least one second mark formed with the laser to measure alignment of the printing ink stage and the laser process stage.

2. A method as claimed in claim 1, further comprising making a negative mark with the laser onto the at least one first mark that had been made with printing ink by operating the laser for removing ink, then scanning the at least one first mark made with printing ink and the laser negative mark, and comparing the mutual positioning of the at least one first mark made with printing ink and the negative mark formed by the laser once the negative mark formed with the laser has been formed.

3. A method as claimed in claim 1, further comprising scanning reflected and/or penetrated light during forming with the laser.

4. A method as claimed in claim 1, wherein the at least one first mark made with printing ink is formed in connection with patterning remaining hidden under a layer formed subsequent to a formation of the patterning in such a way that the at least one first mark formed with printing ink is used to align the hidden layer, the at least one first mark formed with printing ink remains outside the subsequent layer, and the at least one laser process stage is aligned by means of aligning the printed at least one first mark to the patterning in the hidden layer.

5. A method as claimed in claim 4, wherein the patterning remaining hidden comprises adhesive patterning by means of which a foil or layer is selectively connected to a printed circuit board.

6. A method as claimed in claim 1, wherein, before the at least one laser process stage, the at least one first mark is formed on the base material of the web on which at least one first mark the laser beam forms the at least one second mark, and controlling the at least one laser process stage by reading both the at least one second mark made with the laser beam and the at least one first mark formed on the base material of the web.

7. A method as claimed in claim 1, further comprising controlling the at least one laser process stage to align the laser processing with one or more process stages preceding it, the laser processing being aligned with the one or more process stages in a longitudinal direction of travel of the web or in a transverse direction relative to the longitudinal direction of travel of the web or in a direction at a first angle relative to the longitudinal direction and at a second angle relative to the transverse direction.

8. A method as claimed in claim 2, further comprising controlling the laser process stage to scale the at least one laser processing to match with one or more process stages preceding it.

9. A method as claimed in claim 1, wherein at least two adjacent laser devices are arranged in a transverse direction relative to a longitudinal direction of travel of the web, whereby the parallel laser devices form the at least one second mark on the edge, or close to the edge, of the working area of the adjacent device, and the mutual alignment of two or more laser devices is measured with respect to the adjacent device.

10. A laser process alignment measuring method applicable to a manufacturing process including at least one laser process stage, comprising:

before the at least one laser process stage, applying at least one first mark on a surface of a base material of a web with printing ink, a laser beam being used on the at least one first mark forming at least one second mark by removing the printing ink;

at the at least one laser process stage, forming the at least one second mark with the laser beam onto the at least one first mark printed with printing ink by removing the printing ink; and optically reading the positions of the at least one first mark printed with printing ink and the at least one second mark formed with the laser to measure alignment of the printing ink stage and the at least one laser process stage, wherein the removal of the printing ink exposes the surface of the base material of the web.

\* \* \* \* \*